(12) United States Patent
Tolbert et al.

(10) Patent No.: US 7,829,812 B2
(45) Date of Patent: Nov. 9, 2010

(54) INPUT DEVICE AND AN ELECTRONIC DEVICE COMPRISING AN INPUT DEVICE

(75) Inventors: William Haywood Tolbert, Malmö (SE); Johan Magnus Rikard Steijner, Löddeköpinge (SE)

(73) Assignee: Sony Ericsson Mobile Communications AB, Lund (SE)

( * ) Notice: Subject to any disclaimer, the term of this patent is extended or adjusted under 35 U.S.C. 154(b) by 181 days.

(21) Appl. No.: 11/858,980

(22) Filed: Sep. 21, 2007

(65) Prior Publication Data

US 2009/0008234 A1    Jan. 8, 2009

Related U.S. Application Data

(60) Provisional application No. 60/947,710, filed on Jul. 3, 2007.

(51) Int. Cl.
H03K 17/975 (2006.01)

(52) U.S. Cl. .................. 200/600; 200/5 A

(58) Field of Classification Search ........... 200/5 A, 200/512–520, 310–315, 341–345; 345/173
See application file for complete search history.

(56) References Cited

U.S. PATENT DOCUMENTS

| | | | | |
|---|---|---|---|---|
| 3,796,843 A * | 3/1974 | Durkee et al. | ............. | 200/5 A |
| 3,886,012 A * | 5/1975 | Slater | ............. | 156/73.1 |
| RE30,923 E * | 5/1982 | Durkee et al. | ............. | 200/5 A |
| 4,598,181 A * | 7/1986 | Selby | ............. | 200/5 A |
| 4,672,153 A * | 6/1987 | Kikuchi | ............. | 178/18.09 |
| 5,603,400 A * | 2/1997 | Goto et al. | ............. | 200/302.3 |
| 5,664,667 A * | 9/1997 | Kenmochi | ............. | 200/314 |
| 6,697,091 B1 * | 2/2004 | Rzepkowski et al. | ......... | 715/835 |
| 6,756,555 B2 * | 6/2004 | Lin | ............. | 200/512 |
| 6,784,384 B2 * | 8/2004 | Park et al. | ............. | 200/11 R |
| 6,977,352 B2 * | 12/2005 | Oosawa | ............. | 200/314 |

(Continued)

FOREIGN PATENT DOCUMENTS

EP    0 490 712 A1    10/1991

(Continued)

OTHER PUBLICATIONS

International Search Report for corresponding Application No. PCT/EP2007/062617 mailed Mar. 25, 2008.

(Continued)

*Primary Examiner*—Renee S Luebke
*Assistant Examiner*—Lisa Klaus
(74) *Attorney, Agent, or Firm*—Renner, Otto, Boisselle & Sklar, LLP

(57) ABSTRACT

An input device including a support structure, such as a Printed Circuit Board (PCB), and a switch device, e.g. a switch dome, mounted on the support structure. The switch device may be configured to provide tactile feedback to a user upon depression of the switch device by a finger of the user. The input device also comprises a capacitive touch sensing device, e.g. a capacitive touch screen, which is positioned in relation to the switch device such that the capacitive touch sensing device is configured to sense the capacitance of the finger upon depression of the switch device by the finger. The invention also concerns an electronic device, e.g. a mobile phone, comprising one or several input devices.

15 Claims, 7 Drawing Sheets

U.S. PATENT DOCUMENTS

| | | | |
|---|---|---|---|
| 7,070,349 B2 * | 7/2006 | Dombrowski et al. | 400/490 |
| 7,176,898 B2 * | 2/2007 | Litwiller | 345/173 |
| 7,230,198 B2 * | 6/2007 | Cok et al. | 200/512 |
| 7,336,260 B2 * | 2/2008 | Martin et al. | 345/169 |
| 7,378,609 B1 * | 5/2008 | Fedorjaka | 200/516 |
| 7,397,466 B2 * | 7/2008 | Bourdelais et al. | 345/173 |
| 7,403,191 B2 * | 7/2008 | Sinclair | 345/173 |
| 7,411,143 B2 * | 8/2008 | Shin et al. | 200/314 |
| 7,450,110 B2 * | 11/2008 | Shahoian et al. | 345/173 |
| 7,463,249 B2 * | 12/2008 | Knowles et al. | 345/177 |
| 7,488,910 B2 * | 2/2009 | Hong | 200/310 |
| 7,511,702 B2 * | 3/2009 | Hotelling | 345/173 |
| 7,519,748 B2 * | 4/2009 | Kuzmin | 710/67 |
| 7,531,765 B2 * | 5/2009 | Komagata | 200/314 |
| 7,548,232 B2 * | 6/2009 | Shahoian et al. | 345/173 |
| 2002/0144886 A1 | 10/2002 | Engelmann et al. | 200/600 |
| 2003/0136650 A1 | 7/2003 | Lai | 200/1 B |
| 2007/0119698 A1 | 5/2007 | Day | 200/510 |
| 2008/0251364 A1 * | 10/2008 | Takala et al. | 200/341 |

FOREIGN PATENT DOCUMENTS

| | | |
|---|---|---|
| EP | 0 597 753 A1 | 10/1993 |
| EP | 1 207 543 A3 | 8/2004 |

OTHER PUBLICATIONS

International Preliminary Report on Patentability for corresponding International Application No. PCT/EP2007/062617, dated Sep. 15, 2009.

* cited by examiner

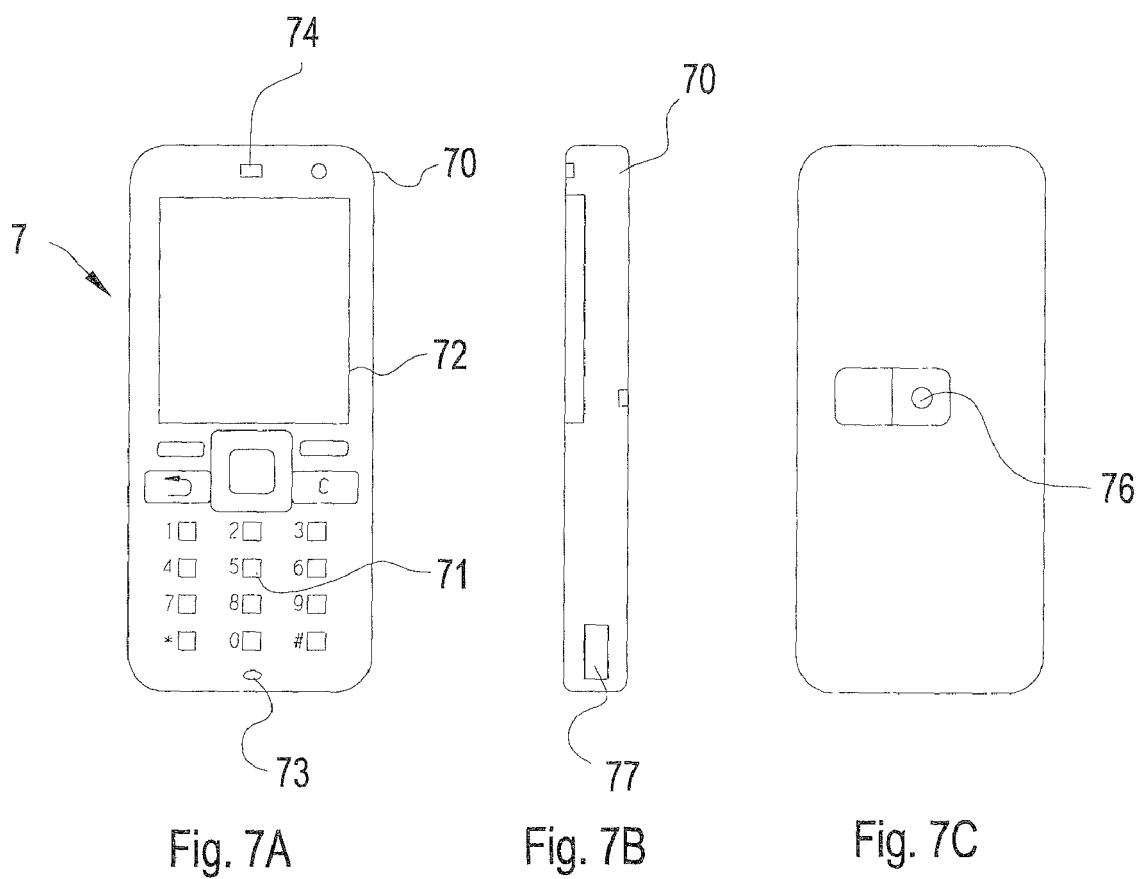

INPUT DEVICE AND AN ELECTRONIC DEVICE COMPRISING AN INPUT DEVICE

CROSS REFERENCE TO RELATED APPLICATION

This application claims priority under 35 U.S.C. §119 to U.S. Provisional Application No. 60/947,710, filed Jul. 3, 2007, the entire disclosure of which is incorporated herein by reference.

TECHNICAL FIELD

The present invention relates in general to an input device for inputting information to an electronic device. The present invention also relates to electronic devices, such as mobile terminals, e.g., mobile telephones, personal digital assistants (PDAs), digital camera devices and/or handheld computers, including one or several such input devices.

BACKGROUND

A variety of portable electronic devices, such as mobile terminals (e.g., mobile telephones, PDA:s, media players and/or handheld computers), are widely used today. In many of these electronic devices, the keypad can be locked when the portable electronic device is not used. There are many different ways to implement the keypad lock feature. Some mobile terminals use a sequence of two different key-presses to lock the keypad. Some other terminals utilize features like timer lock or keypad lock selection from the menu.

It is known in the prior art that the keypad of a mobile phone (or similar electronic device) can be locked, e.g., by selecting such option from the menu or by pressing a certain key combination. The key-lock function is used to prevent accidental and unintentional key presses, for instance if the device is in a bag, pocket or purse. However, sometimes the user would like to use the device only for one quick operation, e.g. to read a received SMS (Short Message Service) or MMS (Multimedia Messaging Service) message. If the keypad is locked, the user has to unlock the keypad first, subsequently perform the intended operation, and finally remember to lock the keypad again. Another example is when the user wants to use the terminal for a single telephone call, it is then first necessary to unlock the keypad (e.g. by a certain sequence of key-presses), then may be press one or more buttons of the keypad to dial the phone number and after this operation, press two or more keys in a certain sequence to lock the keypad. The above examples of operations may be cumbersome and annoying to some users.

As described earlier, the key-lock function may be used to prevent accidental and unintentional key presses, for instance if the device is placed in a bag/pocket/purse. While the known prior art mobile terminals may provide acceptable locking mechanisms in most cases, there is still a risk that accidental and unintentional key presses occur if the device is in a bag/pocket/purse. For example, if the device is in a bag/pocket/purse it is probable that one or more other objects in the bag/pocket/purse lie against the device. When these objects lie against the device, they may sometimes press the buttons of the keypad of the device by accident. If the device uses a certain key combination for unlocking the key-lock function this certain key combination could in fact be unintentionally or accidentally pressed by the objects lying against the device. There is consequently a risk that the key-lock function would be unintentionally unlocked if objects press the certain key combination by accident. This may lead to the keypad being left unlocked, this in turn potentially leading to accidental phone calls or the like. While the timer lock solves this problem partly, there is still the timeout period when random key-presses can initiate unintentional phone calls or interfere with the operation of the device otherwise, e.g., by entering notes into the calendar or by entering names into the phonebook.

SUMMARY OF THE INVENTION

With the above description in mind, then, an aspect of some embodiments of the present invention is to provide an improved input device, which seeks to mitigate, alleviate or eliminate one or more of the above-identified deficiencies in the art and disadvantages singly or in any combination.

An aspect of the present invention relates to an input device for inputting information to an electronic device, the input device comprising:

a support structure;

a switch device, which is mounted on the support structure, for providing tactile feedback to a user upon depression of the switch device by a finger of the user; and a capacitive touch sensing device arranged in relation to the switch device such that it is configured to sense the capacitance of said finger upon depression of the switch device by said finger.

In one embodiment, the input device is operatively connected to a controller, and:

the switch device is configured to output a control signal to the controller upon depression of the switch device, the control signal indicating that inputting of said information is requested, the capacitive touch sensing device is configured to output a control signal to the controller when the capacitance of a finger of the user is sensed by the capacitive touch sensing device; and the controller is configured to initiate the requested inputting of said information only when the controller receives said control signal from both the switch device and the capacitive touch sensing device.

In one embodiment, the capacitive touch sensing device comprises a flexible substrate on which a conductive layer is attached.

In one embodiment, the capacitive touch sensing device abuts against the switch device.

In one embodiment, the capacitive touch sensing device is configured to actuate towards said switch device upon depression of said capacitive touch sensing device.

In one embodiment, the capacitive touch sensing device further comprises an actuator for actuating towards said switch device upon depression of said capacitive touch sensing device.

In one embodiment, the capacitive touch sensing device is attached onto a keymat substrate and the keymat substrate comprises an actuator for actuating towards said switch device upon depression of said capacitive touch sensing device.

In one embodiment, the input device further comprises a button, wherein the button is attached onto the capacitive touch sensing device.

In one embodiment, the input device further comprises a button, wherein the button is coated with a conductive layer for forming the capacitive touch sensing device on the button.

In one embodiment, the button is attached onto a substrate and the substrate comprises an actuator for actuating towards said switch device upon depression of said button.

In one embodiment, said support structure comprises capacitive touch sensors for forming the capacitive touch sensing device.

In one embodiment, the switch device is a switch dome.

In one embodiment, the capacitive touch sensing device is a capacitive touch screen.

The features of the above-mentioned embodiments can be combined in any combinations.

Another aspect of the present invention relates to an electronic device comprising at least one input device for inputting information to the electronic device, wherein the at least one input device includes:

a support structure;

a switch device, which is mounted on the support structure, for providing tactile feedback to a user upon depression of the switch device by a finger of the user; and a capacitive touch sensing device arranged in relation to the switch device such that it is configured to sense the capacitance of said finger upon depression of the switch device by said finger.

In one embodiment, the electronic device further comprises a controller, wherein the input device is operatively connected to said controller and wherein:

the switch device is configured to output a control signal to the controller upon depression of the switch device, the control signal indicating that inputting of said information is requested, the capacitive touch sensing device is configured to output a control signal to the controller when the capacitance of a finger of the user is sensed by the capacitive touch sensing device; and the controller is configured to initiate the requested inputting of said information only when the controller receives said control signal from both the switch device and the capacitive touch sensing device.

In one embodiment, the capacitive touch sensing device comprises a flexible substrate on which a conductive layer is attached.

In one embodiment, the capacitive touch sensing device abuts against the switch device.

In one embodiment, the capacitive touch sensing device is configured to actuate towards said switch device upon depression of said capacitive touch sensing device.

In one embodiment, the capacitive touch sensing device further comprises an actuator for actuating towards said switch device upon depression of said capacitive touch sensing device.

In one embodiment, the capacitive touch sensing device is attached onto a keymat substrate and the keymat substrate comprises an actuator for actuating towards said switch device upon depression of said capacitive touch sensing device.

In one embodiment, the input device further comprises a button, wherein the button is attached onto the capacitive touch sensing device.

In one embodiment, the input device further comprises a button, wherein the button is coated with a conductive layer for forming the capacitive touch sensing device on the button.

In one embodiment, the button is attached onto a substrate and the substrate comprises an actuator for actuating towards said switch device upon depression of said button.

In one embodiment, said support structure comprises capacitive touch sensors for forming the capacitive touch sensing device.

In one embodiment, the switch device is a switch dome.

In one embodiment, the capacitive touch sensing device is a capacitive touch screen.

In one embodiment, the electronic device comprises a keypad and said input device is an input device of said keypad.

In one embodiment, the electronic device comprises a camera and the input device is an image recording trigger for capturing an image by the camera.

The electronic device may, for instance, be a device from the group comprising: a portable radio communication equipment, a mobile radio terminal, a mobile telephone, a cellular telephone, a pager, a communicator, an electronic organizer, a smart phone, a camera device, and a media player.

The features of the above-mentioned embodiments can be combined in any combinations.

Some embodiments of the invention provide an improved input device suitable for the prevention of inadvertent input. It is an advantage with some embodiments of the invention that they may allow for an improved locking mechanism that can be utilized in electronic devices where it may be important or even necessary to avoid unintentional key presses on the electronic device e.g. for preventing inadvertent input if the electronic device is placed in a pocket, bag or purse. It is another advantage with some embodiments of the invention that they may allow for an input device that can be operated faster to perform a single quick operation. Still another advantage with some embodiments of the invention is that they may be utilized for different applications, e.g., as a key or button of a keypad of an electronic device or as an image recording trigger of a camera device.

BRIEF DESCRIPTION OF THE DRAWINGS

Further objects, features and advantages of the present invention will appear from the following detailed description of the invention, wherein embodiments of the invention will be described in more detail with reference to the accompanying drawings, in which:

FIG. 7A schematically illustrates a front view of an electronic device, in the form of a camera phone, according to an embodiment of the invention;

FIG. 7B schematically illustrates a side view of the electronic device of FIG. 7A, wherein the side comprises an image recording trigger for capturing an image with the camera of the electronic device;

FIG. 7C schematically illustrates a rear view of the electronic device of FIGS. 7A and 7B, where the rear side includes a camera;

DETAILED DESCRIPTION

Figure 1:
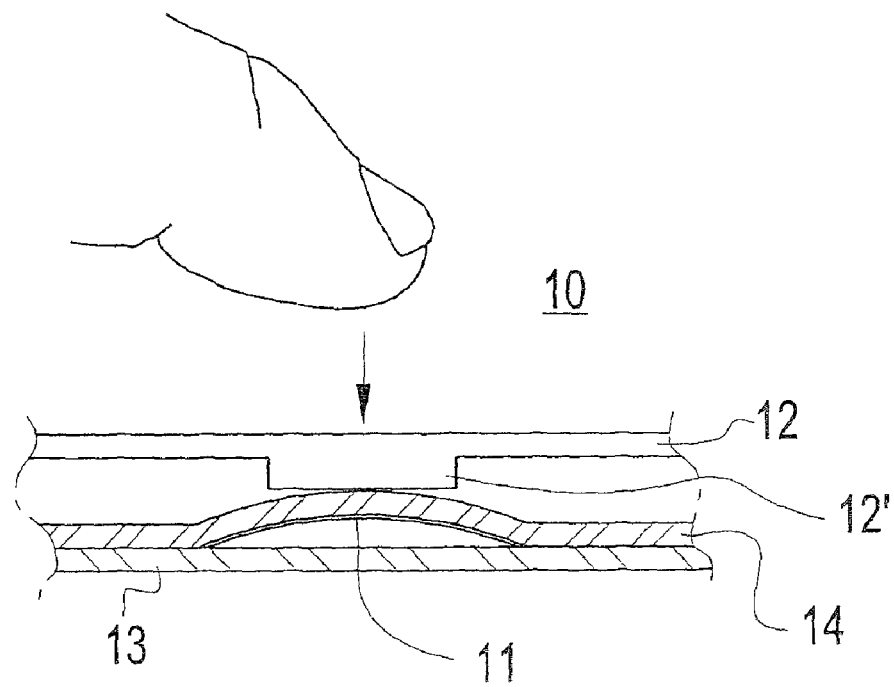
FIG. 1 illustrates an input device according to an embodiment of the invention.

Embodiments of the present invention relate, in general, to the field of electronic devices including one or several input devices for inputting information to the electronic device. A preferred embodiment relates to a portable communication device, such as a mobile phone, including one or more input devices. However, it should be appreciated that the invention is as such equally applicable to electronic devices which do not include any radio communication capabilities. However, for the sake of clarity and simplicity, most embodiments outlined in this specification are related to mobile phones.

Embodiments of the present invention will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference signs refer to like elements throughout.

FIGS. 1 to 4 show different embodiments of an input device 10, 20, 30, 40 according to the invention. One or several input devices 10, 20, 30, 40 can, e.g., be employed in an electronic device, such as the mobile telephones illustrated in FIGS. 5 and 7. Common for all embodiments illustrated in FIGS. 1 to 4 is that the input device 10, 20, 30, 40 comprises a switch device 11, 21, 31, 41 as well as a touch sensing device 12, 22, 32, 43, preferably a capacitive touch sensing device. The switch device 11, 21, 31, 41 and the capacitive touch sensing device 12, 22, 32, 43 may be depressible simultaneously upon depression of the input device 10, 20, 30, 40. The switch device 11, 21, 31, 41 may be configured to provide tactile feedback to the user upon depression. That is, it is desirable that the switch device 11, 21, 31, 41 is configured to provide tactile feedback to the user upon depression. However, it should be appreciated that it is not necessary that the switch device 11, 21, 31, 41 is configured to provide tactile feedback to the user upon depression. The capacitive touch sensing device 12, 22, 32, 43 operates by sensing the capacitance of the finger of the user when the finger touches the capacitive touch sensing device 12, 22, 32, 43 of the input device 10, 20, 30, 40 or when the finger approaches the capacitive touch sensing device 12, 22, 32, 43 and, hence, is in proximity to the capacitive touch sensing device 12, 22, 32, 43 of the input device 10, 20, 30, 40. Capacitive sensors may be laid out along the horizontal and vertical axes of the touch sensing device 12, 22, 32, 43. The location of the finger may be determined from the pattern of capacitance from these sensors. The capacitive touch sensing device will not sense the tip of a pencil, a stylus or other similar object.

The hereinbelow presented various embodiments of the invention differ from existing input devices, inter alia, in that they assume the use of a combination of the switch device 11, 21, 31, 41 and the capacitive touch sensing device 12, 22, 32, 43. As will be described further herein, this use of both a switch device 11, 21, 31, 41 and a capacitive touch sensing device 12, 22, 32, 43 provides for an improved input device, which is suitable for preventing inadvertent input, e.g. when an electronic device employing one or more such input devices 10, 20, 30, 40 is placed in a bag, pocket or purse.

FIG. 1 illustrates a first embodiment of an input device 10 according to the invention. The input device 10 is operatively connected to electronic circuits (not shown) in the electronic device, in which the input device 10 is implemented. A switch device in the form of a switch dome 11 is mounted on a support structure 13, such as a Printed Circuit Board (PCB) or the like. The PCB may be a rigid PCB or a flexible printed circuit (FPC). In this example, the switch dome 11 is configured to provide tactile feedback for a user when the user pushes or presses the switch dome 11 with his finger. In the embodiment shown in FIG. 1, the switch dome 11 is a metal dome switch. The metal dome switch may be covered by a dome cover layer 14. The dome cover layer 14 may be made of any flexible material such as, e.g., plastic, rubber, Polyethylene terephthalate (PET), etc. However, it should be appreciated that the switch dome 11 could equally possibly be a plastic switch dome. If the switch dome 11 is a plastic switch dome it is not necessary to provide the plastic switch dome with the dome cover layer 14 and, hence, the dome cover layer 14 can be dispensed with. The input device 10 also comprises a capacitive touch sensing device. In this example, the capacitive touch sensing device is in the form of a capacitive touch screen. In this example, the capacitive touch screen comprises a flexible substrate 12 on which a conductive layer is attached. As can be seen in FIG. 1, the capacitive touch screen 12 is positioned relative to the switch dome 11 such that, upon depression of the input device 10 (or more specifically the capacitive touch screen 12) e.g. by the finger of the user, the capacitive touch screen 12 actuates towards the switch dome 11 for depressing the switch dome 11. The capacitive touch screen 12 is configured to sense the capacitance of the finger of the user when said finger depresses the touch screen for actuating towards the switch dome 11 or when said finger approaches the touch screen 12 and is in proximity thereof. The switch dome 11 and the capacitive touch screen 12 may be depressible, e.g. by said finger, substantially or almost simultaneously.

As described earlier, the capacitive touch screen 12 may comprise a flexible substrate on which a conductive layer is coated. The flexible substrate could e.g. be a FPC. In one embodiment, the flexible substrate is coated with a conductive layer, typically indium tin oxide or, alternatively, copper that is capable of conducting a continuous electrical current across the conductive layer. The capacitive touch screen 12 may therefore exhibit a controlled field of stored electrons in both horizontal and vertical axes—it achieves capacitance. The human body is also an electronic device which has stored electrons and, therefore, also exhibits capacitance. When the 'normal' capacitance field (i.e. reference state) of the capacitive touch screen 12 is altered by another capacitance field, e.g., someone's finger, electronic circuits at each corner of capacitive touch screen 12 may measure the resultant distortion in the sine wave characteristics of the reference capacitance field. A controller included in the electronic device, in which the input device 10 is included may receive the information of the resultant distortion in the sine wave characteristics of the reference field for operational processing. The capacitive touch screen 12 can be touched by a bare finger or with a conductive device being held by a bare hand. However, the capacitive touch screen 12 is not affected by outside objects such as a tip of a pencil or other similar object.

As described earlier, the input device 10 is operatively connected to a controller such as a Central Processing Unit (abbreviated CPU) (not shown) included in the electronic device, in which the input device 10 is implemented. The switch dome 11 is configured to provide a control signal to the controller upon depression of the switch dome, the control signal indicating that inputting of information or a command is requested. In this embodiment, the capacitive touch screen 12 comprises an actuator 12' for actuating towards the switch dome 11. This actuator 12' is optional and could be dispensed with in other embodiments. When an object such as the finger presses or pushes towards the flexible capacitive touch screen 12, the actuator 12' will then substantially or almost simultaneously move towards the switch dome 11 to thereby push the switch dome 11. The flexible capacitive touch screen 12 is configured to provide a control signal to the controller for providing information about a touch that is sensed by the capacitive touch screen, e.g., in a manner as described hereinabove. Moreover, the controller is configured to initiate the requested inputting of the information or the command only when it is determined by the controller that a touch is sensed by the capacitive touch screen, i.e. when the touch screen is activated.

By providing a combination of a switch dome 11 and a capacitive touch screen 12 in an input device 10, it is possible to utilize such input device 10 in an electronic device for preventing inadvertent inputs. Furthermore, such combination of a switch dome 11 and a capacitive touch screen 12 may be utilized in an input device 10 for providing an improved locking mechanism of the electronic device. When the input device 10 is pressed by an object when the electronic device is in a locked mode, the tactile switch dome 11 provides a control signal to the controller upon depression of the input device 10 and, thus, predicts that the electronic device should be altered to unlocked mode. It is also determined by the controller whether the capacitive touch screen 12 has been activated or touched. If the pressing object is a finger, it will be determined that the capacitive touch screen 12 is activated, because the 'normal' capacitance field of the capacitive touch screen 12 is altered by the capacitance field of the finger. On the other hand, if the pressing is by another object such as a pen or any other such element lying against the capacitive touch pad layer 12, it will be determined that the capacitive touch screen 12 is not activated, because the 'normal' capacitance field will not change. Accordingly, since the controller is configured to initiate the requested inputting of the information only when it is determined by the controller that the capacitive touch screen 12 is activated, the electronic device will only alter from locked mode to unlocked mode when the input device 10 is touched by a finger (or similar conductive object), i.e. the touch screen 12 is activated. Since the capacitive touch screen 12 can determine if a finger has been used to activate the touch screen of the input device, objects in a bag/pocket/purse will generally not unintentionally unlock the electronic device when the electronic device is placed in a bag, pocket or purse.

Figure 2:
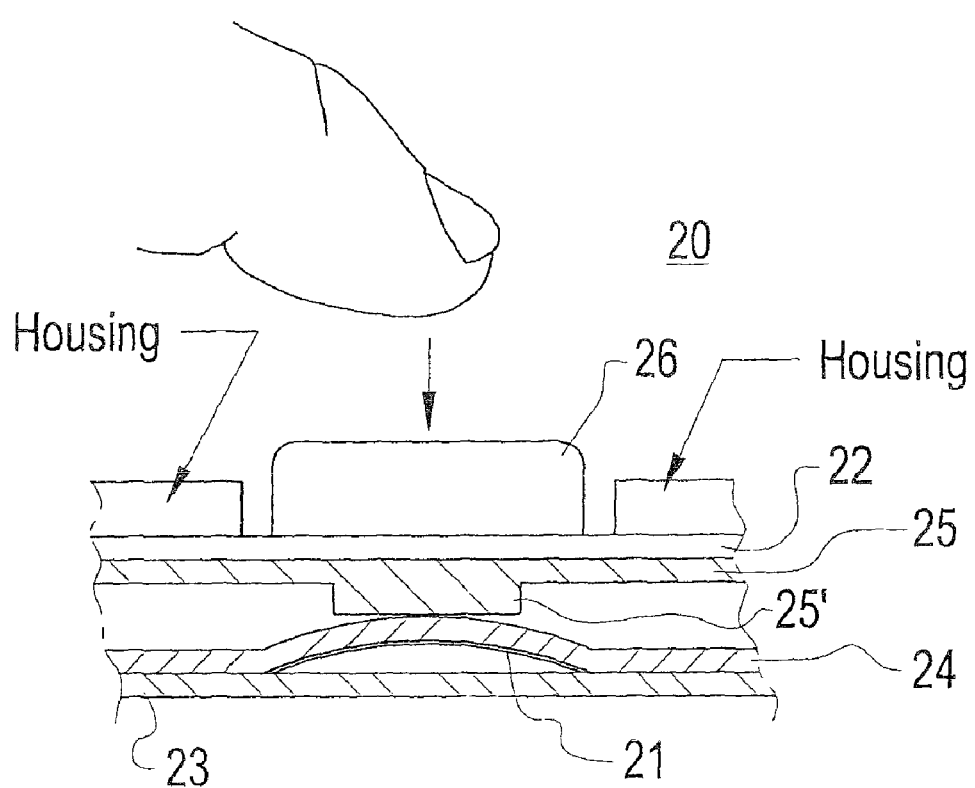
FIG. 2 illustrates an input device according to another embodiment of the invention.

FIG. 2 illustrates a second embodiment of an input device 20 according to the invention. The input device 20 is operatively connected to electronic circuits (not shown) in the electronic device, in which the input device 20 is employed. A switch dome 21 is mounted on a support structure 23, such as a Printed Circuit Board (PCB) or the like. The PCB may be a rigid PCB or a flexible printed circuit (FPC). Like the previous embodiment, the switch dome 21 may suitably be configured to provide tactile feedback for a user when the user pushes or presses towards the switch dome 21 with a finger. The switch dome 21 may be a metal dome switch. The metal dome switch may be covered by a dome cover layer 24. The dome cover layer 14 may be made of plastics. The input device 20 also comprises a capacitive touch sensing device in the form of a capacitive touch screen. In this embodiment, the capacitive touch screen comprises a flexible substrate 22 onto which a conductive layer is coated. Furthermore, the flexible substrate 22 is attached onto another substrate 25, e.g. a keymat substrate. The substrate 25 may be made of silicone or any other flexible material such as, e.g., plastic foil or TPE (Thermoplastic elastomer). Preferably, but not necessarily, the substrate 25 is a thin and flexible keymat substrate. It may act as an intermediate layer between the switch dome 21 and the capacitive touch screen 22. Moreover, the input device 20 comprises a key or button 26, e.g. made of glass or plastics. As is illustrated in FIG. 2, the button 26 may be attached onto the capacitive touch screen 22.

As can be seen in FIG. 2, the button 26, the capacitive touch screen 22, the substrate 25 and the switch dome 21 are positioned relative to each other such that, upon depression of the input device 10 (or more specifically the button 26) e.g. by the finger of the user, the capacitive touch screen 22 actuates towards the substrate 25, which in turn actuates towards the switch dome 21 for depressing the switch dome 21. The button 26, the capacitive touch screen 22, the substrate 25 and the switch dome 21 may be depressible substantially or almost simultaneously.

Similar to the first embodiment of the invention, the capacitive touch screen 22 may comprise a flexible substrate onto which a conductive layer is coated. For instance, the flexible substrate may be coated with a conductive layer, typically indium tin oxide or copper, which conducts a continuous electrical current across the conductive layer. The capacitive touch screen 22 may therefore exhibit a controlled field of stored electrons in both horizontal and vertical axes—it achieves capacitance. The human body is also an electronic device which has stored electrons and, therefore, also exhibits capacitance. When the 'normal' capacitance field (i.e. reference state) of the capacitive touch screen 22 is altered by another capacitance field, e.g., someone's finger, electronic circuits at each corner of capacitive touch screen 22 may measure the resultant distortion in the sine wave characteristics of the reference field. A controller (not shown) included in the electronic device, in which the input device 20 is included may receive the information of the resultant distortion in the sine wave characteristics of the reference field for operational processing. In this embodiment, the button 26 is configured such that a touch by a bare finger (or similar conductive object) on the button 26 can be sensed by the flexible capacitive touch screen 22. This is because the finger comes into sufficient proximity to the touch screen 22 to be able to activate the touch screen 22 when the button 26 is depressed by the finger. In other words, the finger comes into sufficient proximity to the touch screen 22 for the touch screen to sense the capacitance of the approaching finger. However, if the button is instead pushed by other objects, e.g. a tip of a pencil or other similar non-conductive object, the touch screen 22 would not be activated or affected.

The input device 20 is operatively connected to a controller such as a CPU (see e.g. FIG. 6 or FIG. 8) included in the electronic device, in which the input device 20 is employed. The switch dome 21 is configured to provide a control signal to the controller upon depression of the switch dome 21, the control signal indicating that inputting of information is requested. In this embodiment, the intermediate keymat substrate 25 comprises an actuator 25' for actuating towards the switch dome 21 when the input device 20 is depressed. The actuator 25' is configured to push towards the switch dome 21. Thereby, tactile feedback for the user pressing the input device 20 may be provided. The actuator 25' is optional and could be dispensed with in other embodiments. When an object presses towards the button 26, the capacitive touch screen 22 will be pushed towards the switch dome 21, and the actuator 25' of substrate 25 will then substantially or almost simultaneously move towards the switch dome 21 to thereby push or press the switch dome 21. The capacitive touch screen 22 is configured to provide a control signal to the controller for providing information about a touch on the button 26 sensed by the capacitive touch screen 22. Moreover, the controller is configured to initiate the requested inputting of the information only when it is determined by the controller that a touch is sensed by the capacitive touch screen 22.

By providing a combination of a switch dome 21 and a capacitive touch screen 22 in an input device 20, it is possible to utilize such input device 20 in an electronic device for preventing inadvertent input. Furthermore, in a similar way as the first embodiment a combination of the switch dome 21 and the capacitive touch screen 22 of the second embodiment may be utilized in an input device 20 for providing an improved locking mechanism of the electronic device. When the input device 20 is pushed by an object when the electronic device is in a locked mode, the tactile switch dome 21 provides a control signal to the controller upon depression of the input device 20 and, thus, predicts that the electronic device should be altered to unlocked mode. It is also determined by the controller whether the button 26 has been touched by a finger by determining whether the touch screen 22 has been activated. If the pressing object is a finger, it will be determined by the capacitive touch screen 22 that the button 26 is touched, because the 'normal' capacitance field of the capacitive touch screen layer 12 is altered by the capacitance field of the finger (which is in sufficient proximity of the touch screen layer 22 upon depression of the button 26). On the other hand, if the pressing is made by another object such as a pen or any other such element lying against the button 26, it will be determined that the button 26 is not touched by a finger, because the 'normal' capacitance field of the capacitive touch screen 22 will not change. Accordingly, since the controller is configured to initiate the requested inputting of the information when it is determined by the controller that the touch screen 12 is activated, i.e. when the button 26 is pushed or pressed by someone's finger, the electronic device will only alter from locked mode to unlocked mode when the input device 20 is pressed or pushed by a finger (or similar object). Since the capacitive touch screen 22 is capable of determining if a finger has been used to push the button 26, objects in a bag or pocket will not normally unintentionally unlock the electronic device when the electronic device is placed in a bag, pocket or purse.

Figure 3:
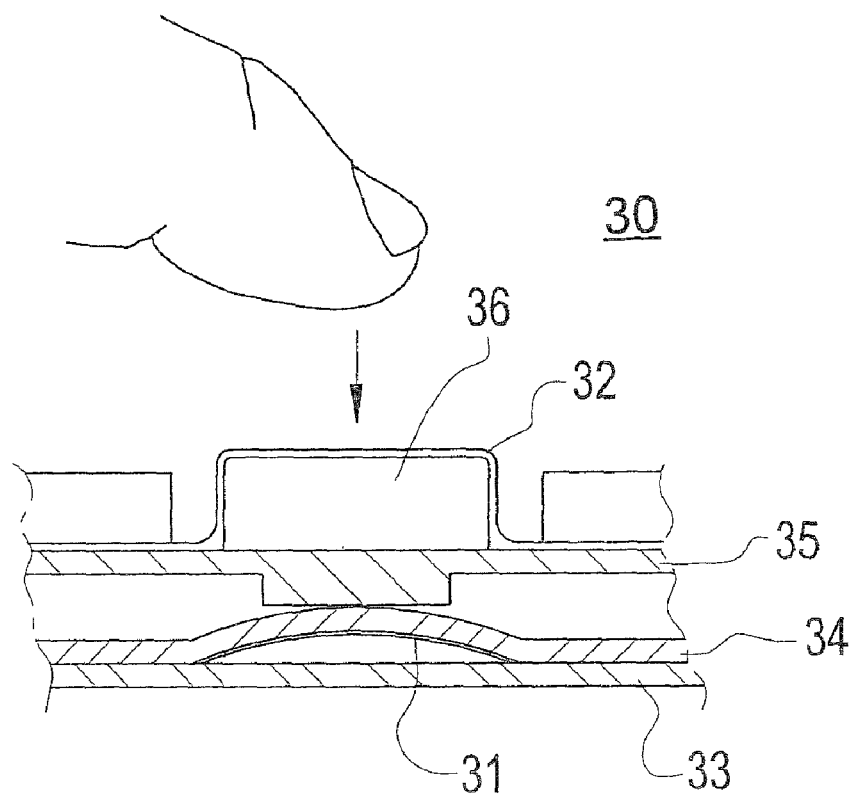
FIG. 3 illustrates an input device according to yet another embodiment of the invention.

FIG. 3 illustrates a third embodiment of an input device 30 according to the invention. The input device 30 is operatively connected to electronic circuits (not shown) in the electronic device, in which the input device 30 is employed. A switch dome 31 is mounted on a support structure 33, such as a Printed Circuit Board (PCB) or the like. The PCB may be a rigid PCB or a FPC. The switch dome 31 may be configured to provide tactile feedback for a user when the user pushes or presses towards the switch dome 31 with his finger. The switch dome 31 may be a metal dome switch. The metal dome switch may be covered by a dome cover layer 34. The dome cover layer 34 may be made of plastics. The input device further comprises a key or button 36. The input device 30 is also provided with a capacitive touch screen 32. More particularly, the button 36 is coated with a thin conductive layer 32 for forming the capacitive touchpad. The button is attached onto a substrate 35, e.g. thin and flexible key mat substrate. The keymat substrate 35 may be made of silicone or any other flexible material such as, e.g., plastic foil or TPE (Thermoplastic elastomer). The substrate 35 may act as an intermediate layer between the switch dome 31 and the button 36 coated with the conductive layer 32. The button 36 including the conductive layer 32 is positioned relative to the switch dome 31 such that, upon depression of the button 36, the button is moveable towards the switch dome for depressing the switch dome 31. The button 36 (and, hence, also the conductive layer 32) and the switch dome 31 may be depressed substantially or almost simultaneously.

Like in the previous embodiments, the conductive layer may be an indium tin oxide or copper layer that conducts a continuous electrical current across the conductive layer 32. The capacitive touch screen may therefore exhibit a controlled field of stored electrons in both horizontal and vertical axes—it achieves capacitance. The human body is also an electronic device which has stored electrons and, therefore, also exhibits capacitance. When the 'normal' capacitance field (i.e. reference state) of the capacitive touch screen 32 is altered by another capacitance field, e.g., someone's finger, electronic circuits at each corner of capacitive touch screen 32 may measure the resultant distortion in the sine wave characteristics of the reference field. A controller included in the electronic device, in which the input device 30 is included may receive the information of the resultant distortion in the sine wave characteristics of the reference field for mathematical processing. The capacitive touch screen 32 coated on the button 36 can be touched by a bare finger or with a conductive device being held by a bare hand. However, the capacitive touch screen 32 is not affected by outside objects such as a tip of a pencil or other similar object.

The input device 30 is operatively connected to a controller, such as a CPU (see e.g. FIG. 6 or FIG. 8), included in the electronic device, in which the input device 30 is implemented. The switch dome 31 is configured to provide a control signal to the controller upon depression of the switch dome 31, the control signal indicating that inputting of information or is requested. As can be seen in FIG. 3, the intermediate substrate 35 comprises an actuator for actuating towards the switch dome 31 when the button 36 is depressed. The actuator is configured to move towards the switch dome 31. The actuator is optional and could be dispensed with in some embodiments. When an object presses or pushes towards the button 36 including the coating of the conductive layer 32, the actuator of substrate 35 will then substantially or almost simultaneously move towards the switch dome 31 to thereby push or press the switch dome 31. The capacitive touch screen formed by the conductive layer 32 is configured to provide a control signal to the controller for providing information about a touch that is sensed by the conductive layer 32, e.g., in a manner as described hereinabove. That is, the conductive layer 32 coated on the button 36 will sense when a finger (or similar conductive object) touches or approaches the button 36. However, the conductive layer 32 of the button 36 will not be affected by outside objects such as a tip of a pencil or other similar object. Moreover, the controller is configured to initiate the requested inputting of the information only when it is determined by the controller that a touch is sensed by the conductive layer 32 of the button 36.

In a similar manner as in the previously described first and second embodiments, the combination of the switch dome 31 and the capacitive touch screen 32 of the button 36 provides for an improved input device 30 which may allow for preventing inadvertent input. The third embodiment has the same or similar advantages as the first and second embodiments as disclosed earlier in this specification and, hence, these will not be further explained here.

Figure 4:
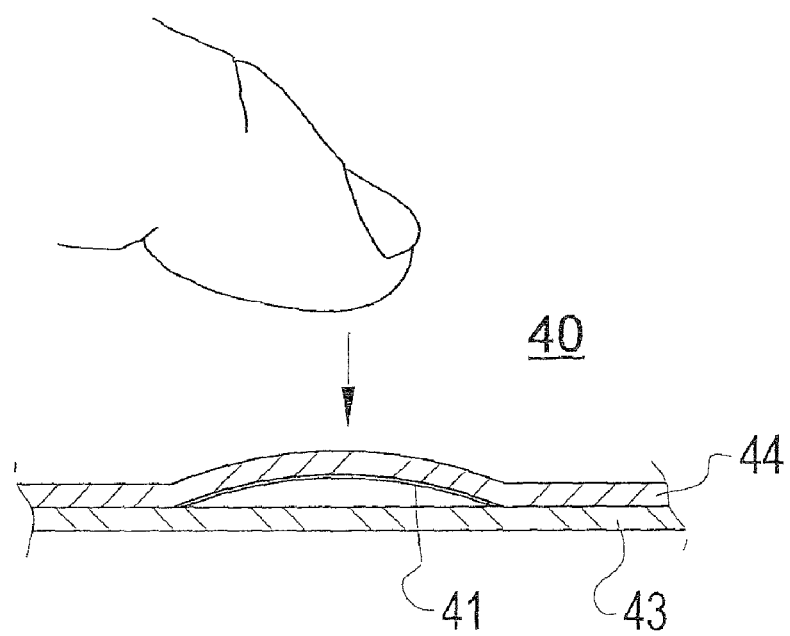
FIG. 4 illustrates an input device according to still another embodiment of the invention.

FIG. 4 illustrates a fourth embodiment of an input device 40 according to the invention. The input device 40 is operatively connected to electronic circuits (not shown) in the electronic device, in which the input device 40 is employed. A switch dome 41 is mounted on a support structure 43, such as a PCB or a FPC. The switch dome 41 may be configured to provide tactile feedback for a user when the user pushes or presses towards the switch dome 41 with his finger. The switch dome 41 may be a metal dome switch. The metal dome switch may be covered by a dome cover layer 44. The dome cover layer 44 may be made of plastics. In this embodiment, the PCB 43 comprises capacitive touch sensors integral with the PCB 43 for forming the capacitive touch sensing device. Thus, the capacitive touch sensing device can be said to be integrated into the PCB 43. For example, capacitive sensors could be defined by a layer of indium tin oxide or a copper layer deposited on the PCB 43. The capacitive touch sensing device integral with the PCB 43 may therefore exhibit a controlled field of stored electrons in both horizontal and vertical axes—it achieves capacitance. The human body is also an electronic device which has stored electrons and, therefore, also exhibits capacitance. When the 'normal' capacitance field (i.e. reference state) of the capacitive touch screen formed by the capacitive sensors is altered by another capacitance field, e.g., someone's finger, electronic circuits at each corner of capacitive touch screen may measure the resultant distortion in the sine wave characteristics of the reference field. A controller (not shown) included in the electronic device, in which the input device 40 is included may receive the information of the resultant distortion in the sine wave characteristics of the reference field for further processing. In this embodiment, the switch dome 41 is configured such that a touch by a bare finger (or similar object) on the switch dome 41 can be sensed by the capacitive touch sensing device integral with the PCB 43. This is because the finger comes into sufficient proximity to the capacitive touch sensors being integral with the PCB when the switch dome is pushed by said finger and, hence, the touch screen can sense the capacitance of the approaching finger. However, the capacitive touch sensing device of the PCB 43 would not be affected by outside objects such as when the switch dome 41 is pressed or pushed by a tip of a pencil or other similar object.

The input device 40 is operatively connected to a controller such as a CPU (not shown) included in the electronic device, in which the input device 40 is implemented. The switch dome 41 is configured to provide a control signal to the controller upon depression of the switch dome 41, the control signal indicating that inputting of information or a command is requested. The switch dome 41 may also be configured to provide tactile feedback for the user pressing the switch dome 41. When someone's finger presses towards the switch dome 41, the capacitive touch sensing device integral with the PCB 43 will be activated. The capacitive touch sensing device of the PCB 43 is thus configured to provide a control signal to the controller for providing information about a touch that is sensed by the capacitive touch sensing device formed by the capacitive sensors integral with the PCB 43. That is, the capacitive touch sensing device of the PCB 43 will sense touches by a bare finger or by a conductive device being held by a bare hand. However, the capacitive touch sensing device of the PCB 43 will not be affected by outside objects such as a tip of a pencil or other similar object. Moreover, the controller is configured to initiate the requested inputting of the information or the command only if it is determined by the controller that a touch is sensed by the capacitive touch screen.

By providing a combination of a switch dome 41 and a capacitive touch screen integral with the PCB 43 in an input device 40, it is possible to utilize such input device 40 in an electronic device for preventing inadvertent input. The fourth embodiment has the same or similar advantages as the first, second and/or third embodiments of the invention as described earlier in this specification and, hence, these advantages will not be further explained here.

Embodiments of the input device 10, 20, 30, 40 as described above may be implemented in a wide variety of electronic devices. The electronic device may e.g. be a portable radio communication equipment, a mobile radio terminal, a mobile telephone, a cellular telephone, a pager, a communicator, an electronic organizer, a smart phone, a camera, an audio player or a media player. For illustrative purposes, some embodiments of an electronic device, comprising at least one input device in accordance with any of the embodiments of the input device 10, 20, 30, 40 will be further described below.

Figure 5:
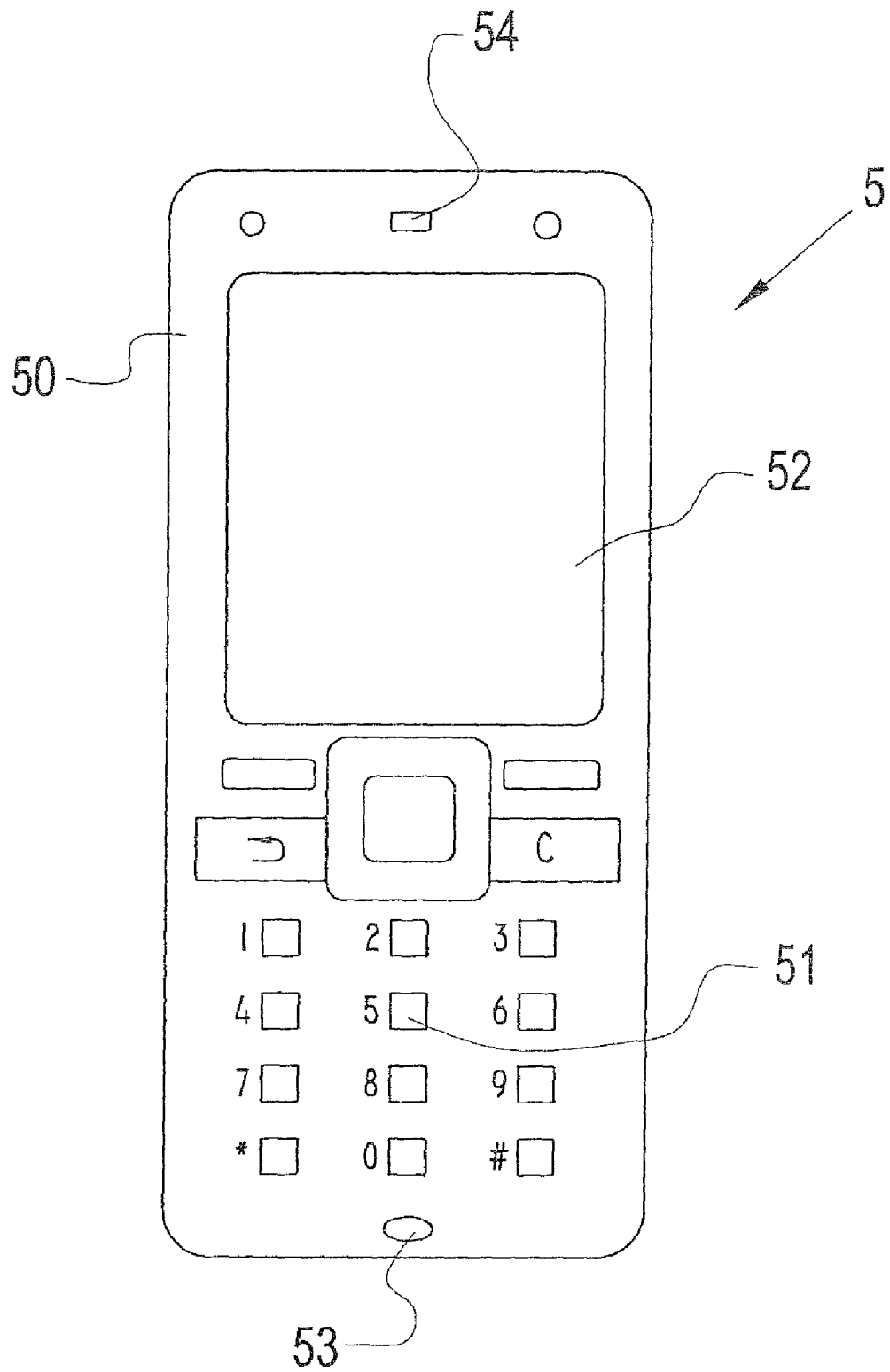
FIG. 5 schematically illustrates a front view of an electronic device, in the form of a mobile phone, wherein the front side comprises a keypad with one or more input devices according to an embodiment of the invention.
Figure 6:
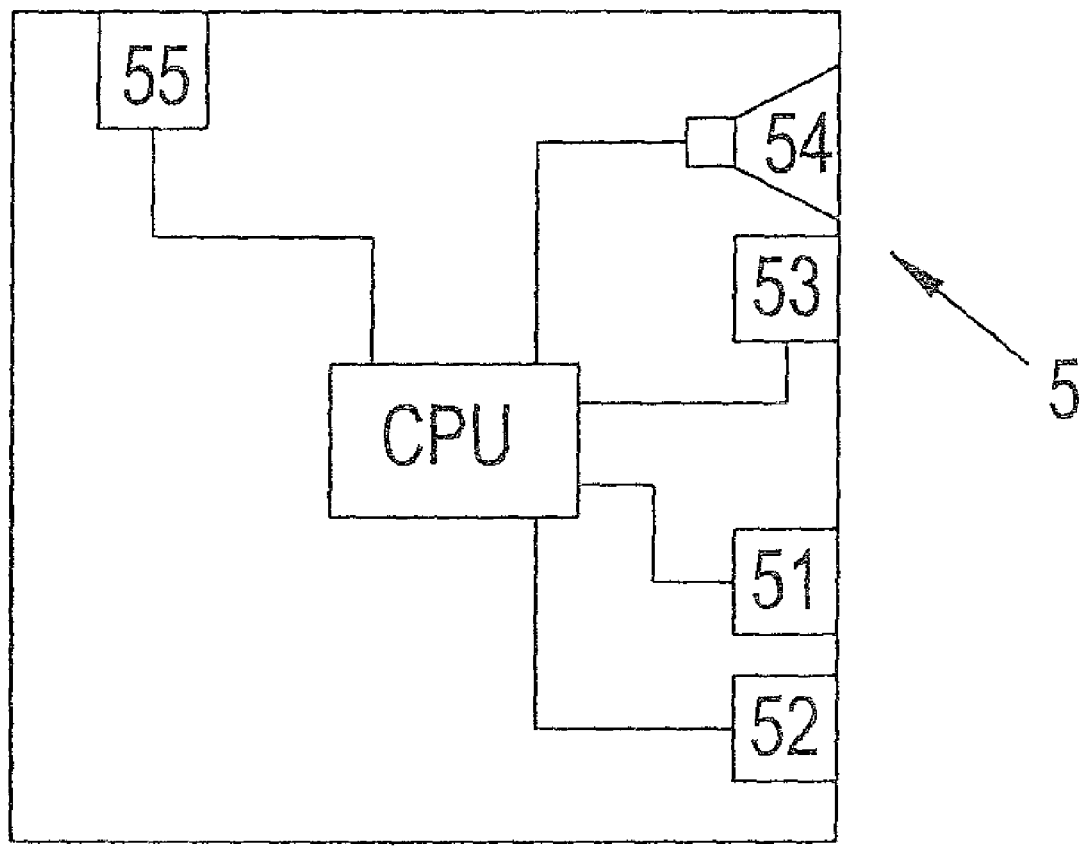
FIG. 6 schematically illustrates a block diagram of functional features of the electronic device shown in FIG. 5 in accordance with an embodiment of the invention.

As a first example, a portable communication device 5 in accordance with an exemplary embodiment of the invention is shown in FIG. 5 and in the form of a block diagram in FIG. 6. The portable communication device 5 may be a mobile phone as depicted in FIG. 5. The portable communication device 5 comprises a support structure 50 including a housing and a chassis, arranged to support other elements of the device. A user interface includes a keypad or keyboard 51 and a display 52. As can be seen in FIG. 5, the keypad comprises several input devices, some or all of which are implemented in accordance with the second embodiment of the input device as described earlier with reference to FIG. 2. Alternatively, some or all of the input devices may be implemented in accordance with the third or fourth embodiments of the input device as described earlier with reference to FIG. 3 and FIG. 4, respectively. Typically, the device 5 also includes an audio interface including a microphone 53 and a speaker 54, as well as radio transceiver circuitry and antenna 55, even though these elements are not of importance for the invention and can be dispensed with if the input device(s) according to the invention is employed in another electronic device, e.g. in a portable electronic organizer such as a PDA. Normally a battery (not shown) is also included in the device 5. The specific function and design of the device 5 as a communication device is known to persons skilled in the art, and will therefore not be described in any greater detail herein. It should also be noted that the list of features and elements included in the device 5 is in no way exhaustive. On the contrary, while the device 5 shown and described represents only one possible embodiment, it may well comprise further features and elements providing other functions.

Figure 7D:
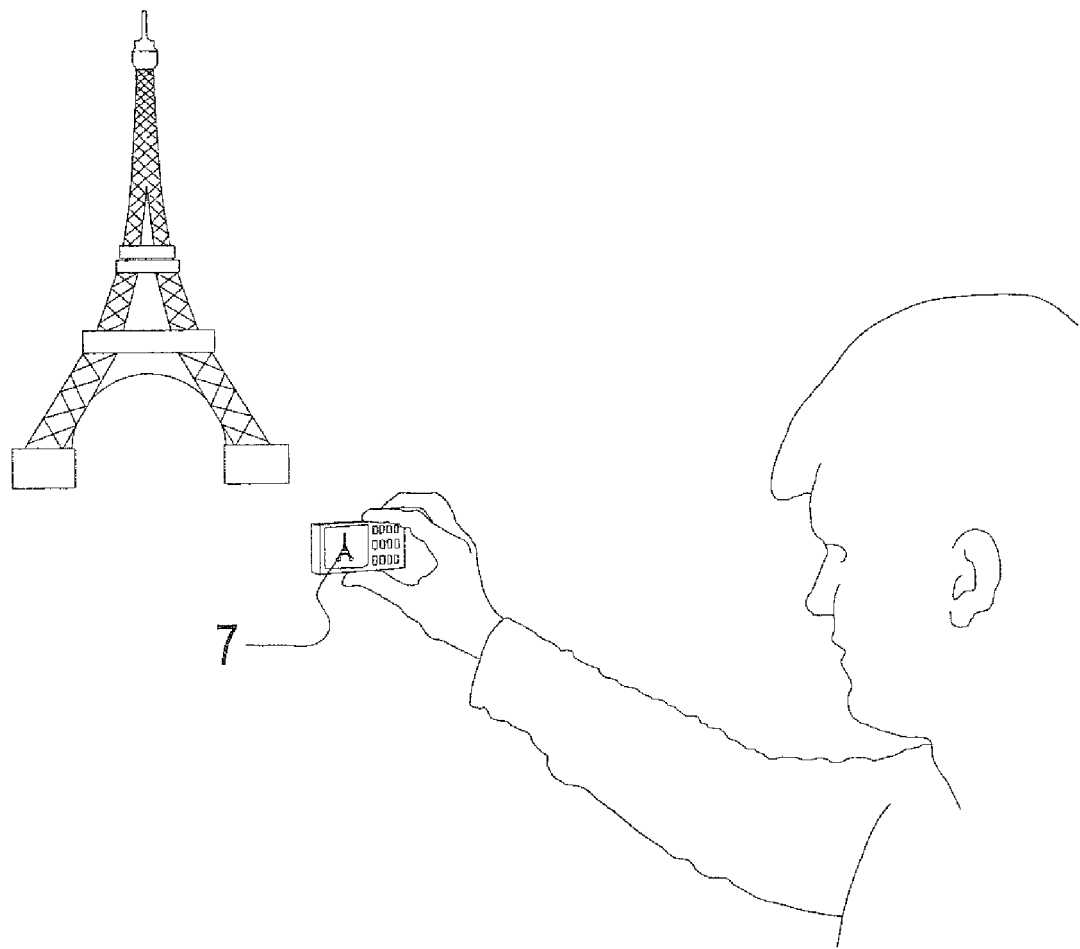
FIG. 7D schematically illustrates a scenario, where a user interacts with and operates the electronic device of FIGS. 7A-7C for capturing an image with the camera of the electronic device.
Figure 8:
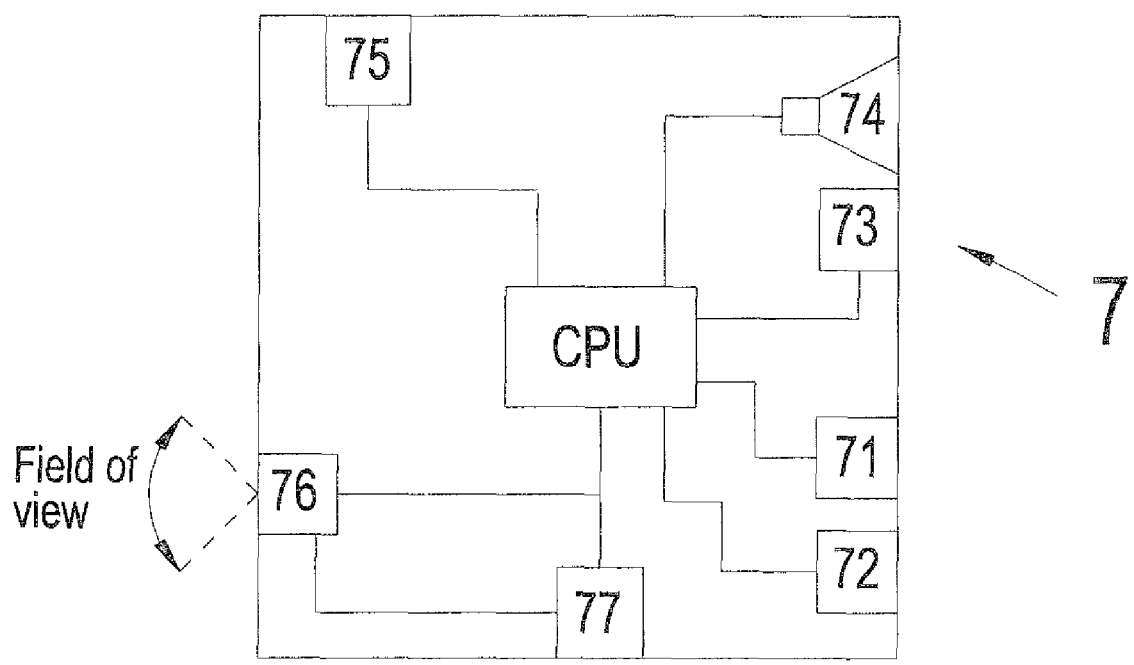
FIG. 8 schematically illustrates a block diagram of functional features of the electronic device shown in FIGS. 7A-7D in accordance with an embodiment of the invention.

As a second example, a camera device 7 in accordance with an exemplary embodiment of the invention is shown in FIGS. 7A-7D from different angles as well as in the form of a block diagram in FIG. 8. The camera device 7 may be a camera phone as depicted in FIG. 7. The camera phone 7 comprises a support structure 70 including a housing and a chassis, arranged to support other elements of the device. A user interface includes a keypad or keyboard 71 and a display 72. Typically, the camera phone 7 also includes an audio interface including a microphone 73 and a speaker 74, as well as radio transceiver circuitry and antenna 75, even though these elements are not of importance for the invention and can be dispensed with if the input device(s) according to the invention is employed in another electronic device, e.g. in a digital camera device having no communication capabilities. Normally a battery (not shown) is also included in the device 7. It should also be noted that the list of features and elements included in the device 7 is in no way exhaustive. On the contrary, while the device 7 shown and described represents only one possible embodiment, it may well comprise further features and elements providing other functions. Apart from the elements outlined above, the camera phone 7 also includes a digital camera 76, an aperture of which is indicated in FIG. 7C. The camera phone 7 further includes an image recording trigger 77 which is indicated in FIG. 7B. FIG. 7D illustrates a scenario, where a user interacts with and operates the camera phone 7 for taking a photo with the camera. In this position, the camera phone 7 has been rotated approximately 90° counter clockwise in relation to the position illustrated in FIG. 7A. In this example, the image recording trigger 77 may be implemented by means of an input device 10, 20, 30, 40 according to any of the embodiments of the present invention as described earlier in this specification. Many camera phones have accelerometers to sense whether the camera phone 7 is in horizontal, i.e. landscape, mode (as shown in FIG. 7D) or in vertical, i.e. portrait, mode (as shown in FIG. 7A). The accelerometer in combination with the various embodiments of the input device 10, 20, 30, 40 of the present invention may be utilized for a camera activation function in a camera phone 7. For example, when the tactile switch dome of the image recording trigger 10, 20, 30, 40 is pressed, it is further determined by the controller whether the input device 10, 20, 30, 40 is pushed by a finger. Substantially or almost simultaneously, the rotational position of the camera phone 7 can be determined, e.g., by means of the accelerometer. For example, if it is determined that a finger pushes the input device 10, 20, 30, 40 and, at the same time, the camera phone 7 is in a horizontal mode, the camera function will be activated. If, on the other hand, the controller cannot recognize a touch by a finger on the capacitive touch sensing device of the input device or if the camera phone 7 is not in horizontal mode, the pressing of the image recording trigger 10, 20, 30, 40 is considered unintentional and the camera function is not activated. In one advantageous embodiment, the image recording trigger 10, 20, 30, 40 may also be utilized for a camera auto focus function. For example, the presence of a finger on the capacitive touch sensing device of the image recording trigger 10, 20, 30, 40 may be scanned continuously. When it is determined by the controller that a finger approaches the capacitive touch sensing device of the image recording trigger 10, 20, 30, 40 (since the capacitive touch sensing device 12, 22, 32, 43 thereof is activated), the auto focus of the camera is activated. Then, the tactile switch dome of the image recording trigger 10, 20, 30, 40 may be used to activate the camera shutter. As compared to known prior art auto focus and shutter functionality, which normally uses a dual-switch, the present implementation may allow for a smaller and less expensive solution. This is because the image recording trigger 10, 20, 30, 40 according to this embodiment of the invention could be made smaller and, thereby, in most cases also less expensive than known prior art dual switches. Moreover, compared to the prior art solution of a dual-switch, the presented solution of a combination of switch dome and capacitive touch sensing device is less complex. Yet further, the presented solution of a combination of switch dome and capacitive touch sensing device may allow for a situation where the user can put less force on the image recording trigger for initiating the auto focus function. A lower force may in turn result in that the user will shake the camera phone less when taking a picture. This may result in better image quality. In terms of usability, the presented solution of a combination of switch dome and capacitive touch sensing device may further result in that it takes less time to initiate the camera function as compared to known prior art methods. Faster access to the camera function may result in fewer missed camera shots.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

The foregoing has described the principles, preferred embodiments and modes of operation of the present invention. However, the invention should be regarded as illustrative rather than restrictive, and not as being limited to the particular embodiments discussed above. The different features of the various embodiments of the invention can be combined in other combinations than those explicitly described. It should therefore be appreciated that variations may be made in those embodiments by those skilled in the art without departing from the scope of the present invention as defined by the following claims.

What is claimed is:

1. An input device for inputting information to an electronic device, the input device comprising:
    a support structure;
    a switch device, which is mounted on the support structure, for providing tactile feedback to a user upon depression of the switch device by a finger of the user;
    a capacitive touch sensing device arranged in relation to the switch device such that it is configured to sense the capacitance of said finger upon depression of the switch device by said finger;
    a button positioned relative to the capacitive touch sensing device such that touch by a finger on a user side of the button can be sensed by the capacitive touch sensing device;
        wherein the user side of the button is coated with a conductive layer forming the capacitive touch sensing device on the button;
        wherein the input device is operatively connected to a controller, and wherein:
        the switch device is configured to output a control signal to the controller upon depression of the switch device, the control signal indicating that inputting of said information is requested;
        the capacitive touch sensing device is configured to output a control signal to the controller when the capacitance of a finger of the user is sensed by the capacitive touch sensing device; and
        the controller is configured to initiate the requested inputting of said information only when the controller receives said control signal from both the switch device and the capacitive touch sensing device.

2. An input device as recited in claim 1, wherein the capacitive touch sensing device is configured to actuate towards said switch device upon depression of said capacitive touch sensing device.

3. An input device as recited in claim 1, wherein the capacitive touch sensing device further comprises an actuator for actuating towards said switch device upon depression of said capacitive touch sensing device.

4. An input device as recited in claim 1, wherein the capacitive touch sensing device is attached onto a keymat substrate and the flexible substrate comprises an actuator for actuating towards said switch device upon depression of said capacitive touch sensing device.

5. An input device as recited in claim 1, wherein the button is attached onto a substrate with the button interposed between the conductive layer and the substrate, and wherein the substrate comprises an actuator for actuating towards said switch device upon depression of said button.

6. An input device as recited in claim 1, wherein the switch device is a switch dome.

7. An electronic device comprising at least one input device for inputting information to the electronic device, wherein the at least one input device includes:
   a support structure;
   a switch device, which is mounted on the support structure, for providing tactile feedback to a user upon depression of the switch device by a finger of the user;
   a capacitive touch sensing device arranged in relation to the switch device such that it is configured to sense the capacitance of said finger upon depression of the switch device by said finger;
   a button, wherein a user side of the button is coated with a conductive layer forming the capacitive touch sensing device on the button;
   a controller, wherein the input device is operatively connected to said controller and wherein:
   the switch device is configured to output a control signal to the controller upon depression of the switch device, the control signal indicating that inputting of said information is requested,
   the capacitive touch sensing device is configured to output a control signal to the controller when the capacitance of a finger of the user on the user side of the button is sensed by the capacitive touch sensing device; and
   the controller is configured to initiate the requested inputting of said information only when the controller receives said control signal from both the switch device and the capacitive touch sensing device.

8. An electronic device as recited in claim 7, wherein the capacitive touch sensing device is configured to actuate towards said switch device upon depression of said capacitive touch sensing device.

9. An electronic device as recited in claim 7, wherein the capacitive touch sensing device further comprises an actuator for actuating towards said switch device upon depression of said capacitive touch sensing device.

10. An electronic device as recited in claim 7, wherein the capacitive touch sensing device is attached onto a keymat substrate and the keymat substrate comprises an actuator for actuating towards said switch device upon depression of said capacitive touch sensing device.

11. An electronic device as recited in claim 7, wherein the button is attached onto a substrate with the button interposed between the conductive layer and the substrate comprises an actuator for actuating towards said switch device upon depression of said button.

12. An electronic device as recited in claim 7, wherein the switch device is a switch dome.

13. An electronic device as recited in claim 7, wherein the electronic device comprises a keypad and said input device is an input device of said keypad.

14. An electronic device as recited in claim 7, wherein the electronic device comprises a camera and the input device is an image recording trigger for capturing an image by the camera.

15. An electronic device according to claim 7, wherein the electronic device is a device from the group comprising: a portable radio communication equipment, a mobile radio terminal, a mobile telephone, a cellular telephone, a pager, a communicator, an electronic organizer, a smart phone, a camera device, a media player.

* * * * *